US007799684B1

(12) United States Patent  
Reid et al.

(10) Patent No.: US 7,799,684 B1  
(45) Date of Patent: Sep. 21, 2010

(54) TWO STEP PROCESS FOR UNIFORM ACROSS WAFER DEPOSITION AND VOID FREE FILLING ON RUTHENIUM COATED WAFERS

(75) Inventors: Jonathan Reid, Sherwood, OR (US); Seyang Park, Beaverton, CA (US); Seshasayee Varadarajan, Lake Oswego, OR (US); Natalia Doubina, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 455 days.

(21) Appl. No.: 11/682,175

(22) Filed: Mar. 5, 2007

(51) Int. Cl.  
*H01L 21/44* (2006.01)

(52) U.S. Cl. .............................. 438/687; 257/E21.311; 257/E21.591

(58) Field of Classification Search ................ 438/687; 257/E21.311, E21.591  
See application file for complete search history.

(56) References Cited

U.S. PATENT DOCUMENTS

| | | | |
|---|---|---|---|
| 1,969,553 A * | 8/1934 | Gernes | 205/240 |
| 3,652,442 A | 3/1972 | Powers et al. | |
| 3,706,651 A | 12/1972 | Leland | |
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |
| 4,357,220 A * | 11/1982 | Eisenmann | 210/644 |
| 4,469,564 A | 9/1984 | Okinaka et al. | |
| 4,604,177 A | 8/1986 | Sivilotti | |
| 4,604,178 A | 8/1986 | Fleegener et al. | |
| 4,605,482 A | 8/1986 | Shiragami et al. | |
| 4,696,729 A | 9/1987 | Santini | |
| 4,828,654 A | 5/1989 | Reed | |
| 4,906,346 A | 3/1990 | Hadersbeck et al. | |
| 4,931,149 A | 6/1990 | Stierman et al. | |
| 4,933,061 A | 6/1990 | Kulkarni et al. | |
| 5,039,381 A | 8/1991 | Mullarkey | |
| 5,096,550 A | 3/1992 | Mayer et al. | |

(Continued)

FOREIGN PATENT DOCUMENTS

EP 0037325 3/1981

(Continued)

OTHER PUBLICATIONS

U.S. Appl. No. 11/179,984, Mayer et al., *Rotationally Asymmetric Variable Electrode Correction*, filed Jul. 11, 2005, 51 pages.

(Continued)

*Primary Examiner*—David S Blum  
(74) *Attorney, Agent, or Firm*—Weaver Austin Villeneuve & Sampson LLP

(57) ABSTRACT

A two-step semiconductor electroplating process deposits copper onto wafers coated with a semi-noble metal in manner that is uniform across the wafer and free of voids. A plating bath nucleates copper uniformly and conformably at a high density in a very thin film. A second bath fills the features. A unique pulsed waveform enhances the nucleation density and reduces resistivity of the very thin film deposited in the nucleation operation. The process produces a thinner and conformal copper seed film than traditional PVD copper seed processes.

40 Claims, 5 Drawing Sheets

U.S. PATENT DOCUMENTS

| | | | |
|---|---|---|---|
| 5,146,136 A | 9/1992 | Ogura et al. | |
| 5,156,730 A | 10/1992 | Bhatt et al. | |
| 5,162,079 A | 11/1992 | Brown | |
| 5,217,586 A | 6/1993 | Datta et al. | |
| 5,316,642 A | 5/1994 | Young, Jr. et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A * | 10/1996 | Datta et al. | 205/652 |
| 5,913,147 A | 6/1999 | Dublin et al. | |
| 5,935,402 A | 8/1999 | Fanti | |
| 5,982,606 A * | 11/1999 | Masuda et al. | 361/225 |
| 6,027,631 A | 2/2000 | Broadbent | |
| 6,113,771 A | 9/2000 | Landau et al. | |
| 6,126,798 A | 10/2000 | Reid et al. | |
| 6,132,587 A | 10/2000 | Jorne et al. | |
| 6,136,707 A | 10/2000 | Cohen | |
| 6,179,983 B1 | 1/2001 | Reid et al. | |
| 6,193,860 B1 | 2/2001 | Weling | |
| 6,197,181 B1 | 3/2001 | Chen | |
| 6,297,157 B1 | 10/2001 | Lopatin et al. | |
| 6,350,366 B1 * | 2/2002 | Landau et al. | 205/182 |
| 6,391,166 B1 * | 5/2002 | Wang | 204/224 R |
| 6,395,152 B1 | 5/2002 | Wang | |
| 6,402,923 B1 | 6/2002 | Mayer et al. | |
| 6,497,801 B1 | 12/2002 | Woodruff et al. | |
| 6,527,920 B1 | 3/2003 | Mayer et al. | |
| 6,569,299 B1 | 5/2003 | Reid et al. | |
| 6,755,954 B2 | 6/2004 | Mayer et al. | |
| 6,773,571 B1 | 8/2004 | Mayer et al. | |
| 6,783,611 B2 | 8/2004 | Yajima et al. | |
| 6,800,187 B1 | 10/2004 | Reid et al. | |
| 2002/0195352 A1 | 12/2002 | Mayer et al. | |
| 2003/0102210 A1 | 6/2003 | Woodruff et al. | |
| 2004/0061919 A1 | 4/2004 | Tench et al. | |
| 2004/0065540 A1 | 4/2004 | Mayer et al. | |
| 2005/0006245 A1 | 1/2005 | Sun et al. | |
| 2005/0009325 A1 | 1/2005 | Chung et al. | |
| 2005/0173252 A1 | 8/2005 | Chen | |
| 2006/0178007 A1 | 8/2006 | Nakamura et al. | |
| 2006/0266655 A1 | 11/2006 | Sun et al. | |
| 2009/0277867 A1 * | 11/2009 | Mayer et al. | 216/13 |
| 2009/0280649 A1 * | 11/2009 | Mayer et al. | 438/676 |
| 2010/0032304 A1 * | 2/2010 | Mayer et al. | 205/97 |

FOREIGN PATENT DOCUMENTS

| | | |
|---|---|---|
| JP | 59-162298 | 9/1984 |
| JP | 09-53197 | 2/1997 |
| JP | 2001316887 | 11/2001 |
| WO | WO/9941434 | 8/1999 |

OTHER PUBLICATIONS

Fang et al., "Uniform Copper Electroplating on Resistive Substrates," Abs. 167, 205$^{th}$ Meeting, © 2004 The Electrochemical Society, Inc., 1 page.

Oliver Chyan et al. "Electrodeposition of Copper Thin Film on Ruthenium", Journal of The Electochemical Society, 150 (5) pp. C347-C350 (2003).

U.S. Office Action dated Feb. 19, 2009 issued in U.S. Appl. No. 12/075,023.

U.S. Office Action dated Sep. 15, 2009 issued in U.S. Appl. No. 12/075,023.

Ken M. Takahashi "Electroplating Copper onto Resistive Barrier Films", Journal of the Electrochemical Society, 147(4) 1414-1417 (2000).

T.P. Hoar and J. N. Agar "Factors in Throwing Power Illustrated by Potential-Current Diagrams", Received Mar. 13, 1947.

"Damascene Cu Electroplating Chemistry", Handbook of Semiconductor Manufacturing Technology, ©2008 by Taylor & Francis Group, LLC.

W.A. Fairweather, "The Throwing Power of Acid Copper Plating Processes for Printed Circuit Boards", MS received May 10, 1983.

U.S. Office Action mailed Mar. 5, 2010 in U.S. Appl. No. 12/075,023.

* cited by examiner

TWO STEP PROCESS FOR UNIFORM ACROSS WAFER DEPOSITION AND VOID FREE FILLING ON RUTHENIUM COATED WAFERS

FIELD OF THE INVENTION

The present invention relates generally to methods and apparatus for depositing copper onto a wafer and more particularly to methods and apparatus for electroplating a copper seed layer on a semiconductor wafer. It is particularly useful for electroplating copper in damascene and dual damascene integrated circuit fabrication methods.

BACKGROUND OF THE INVENTION

Manufacturing of semiconductor devices commonly requires deposition of electrically conductive material on semiconductor wafers. The conductive material, such as copper, is often deposited by electroplating onto a seed layer of copper deposited onto the wafer surface by a PVD or CVD method. Electroplating is a method of choice for depositing metal into the vias and trenches of the processed wafer during damascene and dual damascene processing.

Damascene processing is used for forming interconnections on integrated circuits (ICs). Damascene processing involves formation of inlaid metal lines in trenches and vias formed in a dielectric layer (inter-metal dielectric). In a typical damascene process, a pattern of trenches and vias is etched in the dielectric layer of a semiconductor wafer substrate. A thin layer of diffusion-barrier film such as tantalum, tantalum nitride, or a TaN/Ta bi-layer is then deposited onto the wafer surface by a PVD method, followed by deposition of seed layer of copper on top of the diffusion-barrier layer. Typical materials for diffusion barrier layers include titanium (Ti), tantalum (Ta), tantalum nitride (TaN), tantalum nitride silicon (TaNSi), tungsten (W), titanium nitride (TiN), titanium nitride silicon (TiNSi) and the like.

Because electroplating must occur on a conductive layer, a copper seed layer is first deposited on the diffusion barrier layer with CVD or PVD methods. Chemical vapor deposition (CVD) methods can deposit a conformal copper seed layer with good adhesion, but CVD methods are expensive as compared to PVD processes. Physical vapor deposition (PVD) methods can deposit a copper seed layer with good adhesion, but produces a less conformal film that covers the sidewalls and bottoms of trenches poorly. A thicker PVD seed layer is therefore required to ensure that an electrically conductive layer is provided for subsequent electroplating. The thicker PVD seed layer increases aspect ratios in features and may pinch off the gap opening, making the features harder or impossible to fill with an electroplating process.

As feature sizes decrease, the limitation of a PVD seed layer restricts how small metal lines can be. It is desirable to deposit a very thin copper seed film with good adhesion and conformality so that the aspect ratio of the remaining gap stays within a range that can be filled with an electroplating process. Accordingly, a method of such deposition, and an apparatus allowing practice of such a method, are needed.

SUMMARY

The present invention addresses these needs by providing a two-step semiconductor electroplating process that deposits copper onto wafers coated with a semi-noble metal in uniform and void-free manner. The semi-noble metal is sufficiently conductive to allow direct electroplating of a copper seed layer. It may also serve as all or a portion of the diffusion barrier used in Damascene processing. Electroplating in an appropriate plating bath nucleates copper uniformly and conformably at a high density in a very thin film. The resulting copper seed layer is thinner and more conformal than those produced using traditional PVD copper seed processes. A unique pulsed waveform may be employed to enhance the nucleation density and reduces resistivity of the very thin film deposited in the nucleation operation. After the copper seed layer is formed, electroplating in a different electrolyte fills the features.

In one aspect, the present invention provides a semiconductor processing method for depositing copper. A semi-noble metal layer is deposited onto a semiconductor wafer. The semi-noble metal may be ruthenium, palladium, rhodium, iridium, osmium, cobalt, or nickel, and is preferably ruthenium. The semi-noble metal layer may be a portion of a diffusion barrier, or may be the diffusion barrier. A first plating bath deposits a seed layer of copper onto the semi-noble metal. The first plating bath nucleates copper uniformly and conformably at a high density in a very thin film. The first plating bath uses an electrolyte containing a copper salt and a copper complexing agent. It has a resistivity of at least 200 ohm cm, e.g., between about 200-5000 ohm cm, preferably at between about 400-4000 ohm cm, or even more preferably at between about 1000-2000 ohm cm. Then a second plating bath may be employed to deposit a bulk-layer of copper onto the wafer containing the seed layer. The first and the second copper depositions may be performed under conditions that reduce the terminal effect. Possible conditions include using a high resistivity virtual anode, a sheath, an electrically resistive element such as a plastic barrier with holes placed in the plating cell between the cathode and the anode, one or more azimuthally asymmetric anodes, baffles or plates that can direct cation flow, or a combination of these. The wafer may be spun and dried in between the copper depositions and after the bulk-layer deposition.

The wafer may be pretreated before any copper is deposited. The pretreatment may include annealing and optionally contact with a forming gas (nitrogen and up to 10% hydrogen). The wafer may be heated to about 350-400 degrees Celsius for a period of between about 1 and 5 minutes.

In certain embodiments, an electrolyte containing copper salts and a complexing agent is used in the first electroplating bath for the seed layer deposition. The copper salt may form large anions in the electrolyte solution. For example, possible copper salts include copper citrate, copper pyrophosphate, or copper oxalate. The complexing agent in the electrolyte may be ethylenediaminetetraacetic acid (EDTA), citrate, pyrophosphate, oxalate, or combinations of these. The electrolyte may be acidic with a pH of about 2-6. Specifically, the electrolyte may comprise EDTA at about 0.004-0.007M and copper citrate at 0.004-0.007M. In some cases, the electrolyte also contains a wetting agent.

In certain embodiments, during the seed layer deposition, the electrolyte causes a copper plating reaction to occur at a potential that is about 200-1000 millivolts more cathodic than would occur in a more conventional copper-plating electrolyte. In a specific embodiment, copper seed deposition takes place at a potential of about 0.8-2.0 volts. The seed layer may have a thickness of about 15-50 angstroms. The features on the wafer after the seed layer copper deposition may have an aspect ratio less than 15, preferably less than 10.

As indicated, a unique pulsed current waveform may be applied to the cathode and the anode. In some cases, the waveform has three sections, where substantially all of the copper is deposited in the third section. The first section applies a direct current for a first duration. The second section applies alternating forward and reverse currents for a second duration, which deposits copper and then removes substantially all of the copper deposited. The third section applies another direct current for a third duration. For example, using a 300 mm wafer, the first section applies a direct current of about 0.6-1.0 amps for a period of about 0.5-2 seconds. The second section include forward current pulses of about 0.6-0.9 amps for a period of about 700-1500 milliseconds and reverse current pulses of 0.2-0.5 amps for a period of 400-600 milliseconds. The second section may last about 8-15 seconds, consisting of up to 14 alternating pulse pairs. To deposit about 30-70 angstroms on a 300 mm wafer, the third section applies a direct current of about 0.6-1.0 amps for a period of 10-22 seconds.

In another aspect, the present invention provides a method for electroplating copper onto a wafer. The incoming wafer may be coated with a semi-noble metal layer or a semi-noble metal on which a copper film has previously been deposited using a method such as physical vapor deposition. Copper may be deposited onto a wafer using an electroplating process (e.g., a process similar to that described above for depositing a copper seed layer), followed by a chemical etch process to remove substantially all of the copper deposited. The process may be repeated at least once (preferably twice) before a final layer of copper is deposited using an electroplating process until a desired thickness is reached. The chemical etchant may be peroxide and sulfuric acid, hydroiodic acid, glyoxylic acid, or a combination of these. Any chemical etchant that can etch copper without removing underlying materials may be used.

In another aspect, the present invention pertains to a semiconductor processing apparatus. The apparatus may be a semiconductor processing tool containing one or more electroplating baths and one or more robots capable of transferring wafers. The apparatus includes a controller capable of executing a set of instructions. The set of instructions includes instructions for receiving the special electrolyte discussed above for the seed layer deposition, providing a wafer, and electroplating copper onto the wafer. The instructions may also include instructions for receiving a second electrolyte into a second bath for depositing the bulk-layer and electroplating the bulk-layer copper on a wafer in the second bath. The instructions may also include instructions for electroplating both layer in the same electroplating bath by removing the first electrolyte and receiving the second electrolyte before the bulk-layer deposition. The instructions may also include applying the current waveform as discussed above during the seed layer deposition.

In yet another aspect, the present invention pertains to a semiconductor metallization stack having interconnects. The layers in the sidewalls of the interconnect may be, in order from edge to center, dielectric, semi-noble metal, electroplated copper seed, and bulk copper layers. The seed copper is 15-50 angstroms and is deposited using the electroplating process and electrolyte discussed above. The layers may also include a layer of titanium (Ti), tantalum (Ta), tantalum nitride (TaN), tantalum nitride silicon (TaNSi), tungsten (W), titanium nitride (TiN), or titanium nitride silicon (TiNSi) in between the dielectric and the semi-noble metal, which may be ruthenium. The ruthenium may be deposited using a PVD or an ALD process.

These and other features and advantages of the present invention will be described in more detail below with reference to the associated drawings.

DETAILED DESCRIPTION OF A PREFERRED EMBODIMENT

Introduction and Overview

Figure 1:
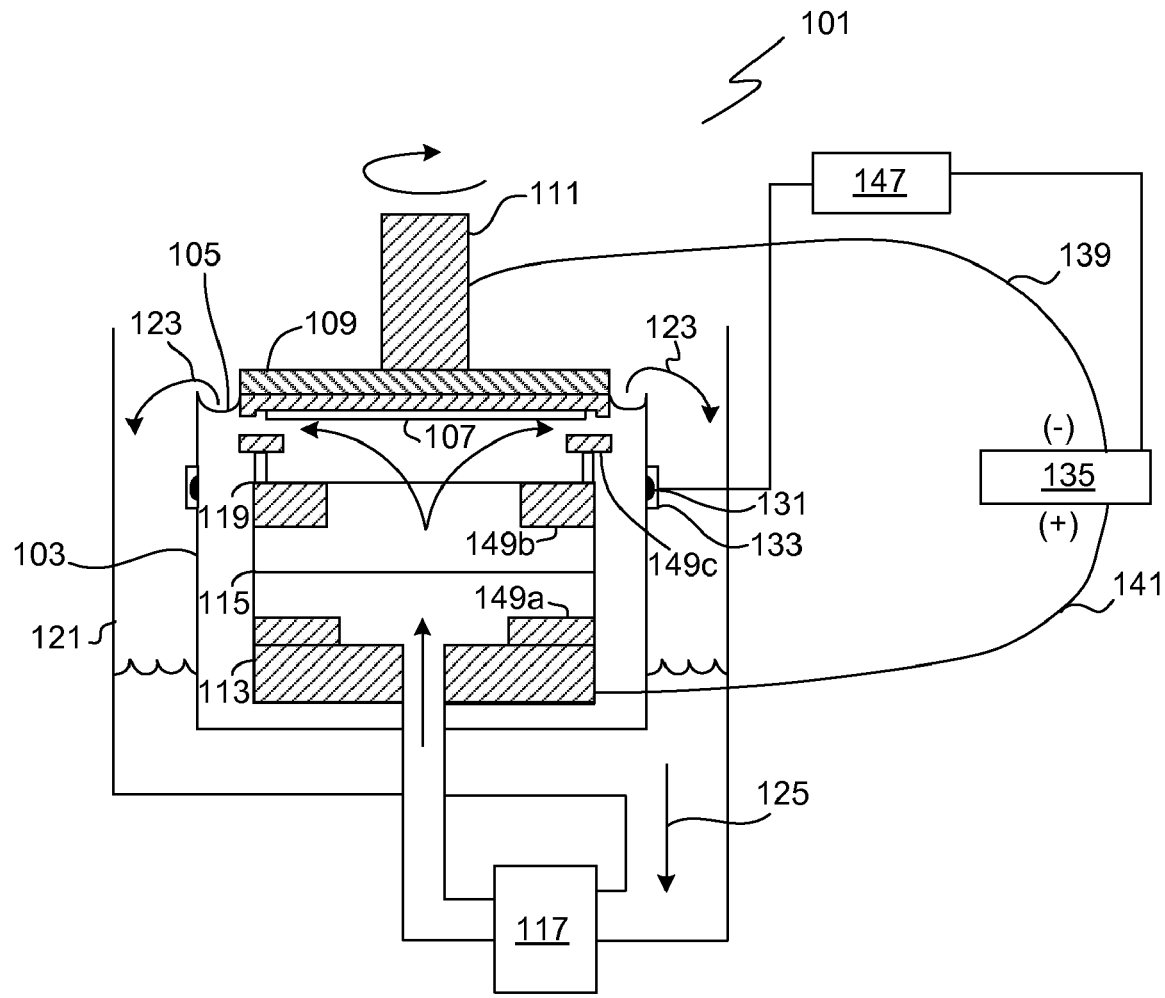
FIG. 1 is a diagrammatic cross-sectional view of one embodiment of an electroplating apparatus in accordance with the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

As the on-chip interconnect wiring dimensions approach the 45 nm scale, barrier materials are occupying an increasing fraction of the area. This is highly undesirable due to the resulting increase line resistance resulting from a decrease in total copper volume as well as possible overhang surrounding the via which causes the copper electrofill to pinch off and leave void defects in the features. In order to achieve finer features, the multi-layer structure must be simplified. As the aggressive scale down of feature sizes continues, there is an increasing demand for a new generation of diffusion barrier materials. Ideal candidates for future diffusion barriers should have good adhesion to both copper and dielectric layer, provide a conductive platform for copper plating and be completely immiscible with copper.

In addition to using new diffusion barrier materials, the copper seed layer process must also be altered in order to overcome the limitations of PVD seed layers. The basic requirements for a copper seed layer are continuous sidewall coverage, adequate opening dimensions at the top of the features so as to allow bottom-up filling during electroplating, and good adhesion to the barrier. Common problems with PVD seed layers include excessive pinch-off near the feature opening leading to voids near the center of features during bottom-up filling, and patchy discontinuous seed layers exposing oxidized Ta barrier onto which electroplating does not take place such that voids are formed along the sides of the features at the locations of exposed barrier.

An electroplating process can deposit a conformal and continuous copper seed layer onto a conductive surface, which is free of insulating oxides. Typical diffusion barrier layers such as tantalum and tantalum nitride have relatively high resistivity (around 220 µΩ-cm) and in addition form highly stable oxides onto which electrodeposition of adherent densely nucleated films is difficult or impossible. Deposition of a conductive elemental layer that forms an oxide that is conductive, reducible to the metal, or soluble in the plating electrolyte has been explored as a means to overcome these problems. Ruthenium and other semi-noble metals, which have a resistivity of about 9 μΩ-cm, may be deposited on a TaN layer to provide diffusion barrier/liners of relatively low resistivity and desirable oxide film properties. In some cases, ruthenium and other semi-noble metals may also be suitable as the barrier layer.

Even though ruthenium is more conductive than TaN, it is still much less conductive than a copper seed using a PVD process. For a thin ruthenium film, the sheet resistance is very high, at about 100-200 ohm/sq. The sheet resistance of the conductive layer increases as its thickness decreases. When the sheet resistance is high, a voltage drop exists between the edge of the wafer where electrical contact is made and the center of the wafer. This resistive drop persists during the electroplating process until sufficient plating increases the conductance across the wafer and reduces the voltage drop. The resistive drop results in a larger voltage driving the plating reaction near the edge of the wafer and thus a faster deposition rate at the wafer edge. As a result the deposited layer has a concave profile with an increased thickness near the edge of the wafer relative to its center. This terminal effect substantially increases the plated thickness near the wafer edge in substrates having seed layers or plated layers with sheet resistances greater than 1 Ohm/square, but will result in progressively greater edge thickness as sheet resistance increases further. The impact of terminal effect in generating thickness variation is mostly concentrated in the outer 15-30 mm of the wafer diameter, especially in substrates having thin seed layers. Therefore, copper deposition on ruthenium with conventional electroplating processes yield edge thick films due to this high resistance.

When plating on a high resistance surface, the electrolyte should ideally have low conductivity. When the bath conductivity is decreased the relative voltage drop between the wafer center and wafer edge compared to the overall voltage drop through the plating cell becomes small. The thickness distribution is improved because the voltage driving the reaction at the wafer edge is not much larger relative to that at the wafer center. The present invention uses a low conductivity (high resistivity) electrolyte that has, e.g., a resistivity higher than 200 ohm cm, preferably higher than about 1000 ohm cm, which is significantly higher than the conventional electroplating baths resistivity of between 2 and 20 ohm cm.

The Electroplating Process

First, general copper electroplating hardware and processes are discussed to provide context for further details of the present invention. Referring to FIG. 1, a diagrammatical cross-sectional view of an electroplating apparatus 101 is shown. The plating vessel 103 contains the plating solution, which is shown at a level 105. A wafer 107 is immersed into the plating solution and is held by, e.g., a "clamshell" holding fixture 109, mounted on a rotatable spindle 111, which allows rotation of clamshell 109 together with the wafer 107. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes. An anode 113 is disposed below the wafer within the plating bath 103 and is separated from the wafer region by a membrane 115, preferably an ion selective membrane. The region below the anodic membrane is often referred to as an "anode chamber." The ion-selective anode membrane 115 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes.

The plating solution is continuously provided to plating bath 103 by a pump 117. Generally, the plating solution flows upwards through an anode membrane 115 and a diffuser plate 119 to the center of wafer 107 and then radially outward and across wafer 107. The plating solution also may be provided into anodic region of the bath from the side of the plating cell 103. The plating solution then overflows plating bath 103 to an overflow reservoir 121 as indicated by arrows 123. The plating solution is then filtered (not shown) and returned to pump 117 as indicated by arrow 125 completing the recirculation of the plating solution. In certain configurations of the plating cell, a distinct electrolyte is circulated through the portion of the plating cell in which the anode is contained and mixing with the main plating solution is prevented using sparingly permeable membranes or ion selective membranes.

A reference electrode 131 is located on the outside of the plating vessel 103 in a separate chamber 133, which chamber is replenished by overflow from the main plating vessel. A reference electrode is typically employed when electroplating at a controlled potential is desired. The reference electrode may be one of a variety of commonly used types such as mercury/mercury sulfate, silver chloride, saturated calomel, or copper metal. In the context of this invention, voltages applied to the wafer are expressed relative to the copper metal reference electrode.

A DC power supply 135 can be used to control current flow to the wafer 107. The power supply 135 has a negative output lead 139 electrically connected to wafer 107 through one or more slip rings, brushes and contacts (not shown). The positive output lead 141 of power supply 135 is electrically connected to an anode 113 located in plating bath 103. The power supply 135 and a reference electrode 131 can be connected to a controller 147, which allows modulation of current and potential provided to the elements of electroplating cell. For example, the controller may allow electroplating either in galvanostatic (controlled current) or potentiostatic (controlled potential) regime. The controller may include program instructions specifying current and voltage levels that need to be applied to various elements of the plating cell, as well as times at which these levels need to be changed. For example, it may include program instructions for transitioning from forward current (depositing copper) to reverse current (removing copper) or from potential-control to current-control upon complete immersion of the wafer into the plating bath or at some later time.

During a forward current pulse, the power supply 135 biases the wafer 107 to have a negative potential relative to anode 113. This causes an electrical current to flow from anode 113 to the wafer 107, and an electrochemical reduction (e.g. $Cu^{2+}+2\ e^-=Cu^0$) occurs on the wafer surface (the cathode), which results in the deposition of the electrically conductive layer (e.g. copper) on the surfaces of the wafer. During a reverse current pulse, the opposite is true. The reaction on the wafer surface is an oxidation (e.g. $Cu^0 \rightarrow Cu^{2+}+2\ e$), which results in the removal of the copper.

The first step of the two-step electroplating process will now be discussed.

Electroplating the Copper Seed

As discussed above, deposition thickness varies between the edge and the center of the wafer when electroplating onto a thin film having a high sheet resistance. Ways to reduce the terminal effect includes different configurations of the plating apparatus, discussed in more detail in the bulk electroplating section. These hardware configurations also may be used during the seed layer deposition. Yet another way to decrease this effect is to increase the resistivity of the electrolyte so that the relative change in potential between the wafer center and wafer edge compared to the overall potential drop through the plating cell becomes small. A special electrolyte, therefore, is required for plating a seed layer of copper onto a ruthenium-coated wafer.

Copper plating electrolytes commonly use a copper salt as ion source. The anions from the salt used can contribute significantly to conductivity of the solution. One factor affecting the conductivity of the electrolyte is the mobility of the ions. A copper salt having larger ions in solution would be less mobile, and the solution less conductive. Suitable salts include copper citrate ($Cu_3(C_6H_5O_7)_2$), copper pyrophosphate ($Cu_2P_2O_7$), and copper oxalate ($CuC_2O_4$). In general, molecular ions which are highly hydrated or which have more than 6 non-hydrogen atoms are sufficiently large to reduce the mobility of the ion in solution and are considered sufficiently large to reduce the conductivity of the electrolyte compared to the effect of equivalent concentration of small highly mobile ions such as hydrogen.

In certain embodiments, the copper seed electrolyte in accordance with the present invention has a resistivity of greater than 200 ohm cm, or a conductivity less than milliSiemens. Preferably, the resistivity is 200-5000 ohm cm, or more preferably, 400-4000 ohm cm, or even more preferably, 1000-2000 ohm cm. One skilled in the art will readily be able to choose a resistivity that allows a thickness distribution within a uniformity requirement on a given ruthenium film resistance using particular hardware configurations. A common uniformity requirement of thickness difference between the edge and the center of the wafer is a range of +/−10%, preferably less than +/−5%.

The electrolyte also includes one or more copper complexing agents. Complexing agents are additives that bind the copper cation in solution, thereby increasing the degree of polarization, or the potential required to reduce the cupric ion to metal. It is believed that the copper nucleation and growth mode is sensitive to the oxidation state of the ruthenium surface. Because ruthenium is deposited in a different process (PVD or ALD) on different semiconductor processing tools, the surface is usually covered with an air-formed oxide film. Failure to remove the air-formed 3D oxide film may result in Volmer-Weber (island) growth on the surface. In order to achieve continuous copper nucleation in the electroplating bath, the surface film must be removed by polarization at negative potentials typically in or approaching the hydrogen evolution region.

A suitable complexing agent is ethylenediaminetetraacetic acid (EDTA). EDTA is a hexadentate (six-toothed) ligand, i.e. it has 6 lone pairs of electrons all of which can form coordinate bonds with the same metal ion. EDTA forms extremely stable complexes with divalent metal cations using all of its complexing sites that give rise to a cage-like structure in which the cation is effectively surrounded by and isolated from solvent molecules. A consequence of the stronger complexing ability of EDTA is that a larger cathodic potential is required for the reduction of cupric ions to copper metal (range of 0.8V to 1.8 V). Such extreme negative copper reduction potential may also reduce the oxide film on ruthenium resulting in continuous nucleation on the surface. If the electrolyte contains no complexing agent, copper will deposit at much lower cathodic potentials (0.6 V). The oxide film will not be removed and poor nucleation would result with the attending effect of rapid growth on initially formed nuclei. Therefore, the plating reaction in accordance with the present invention deposits copper at a potential that is 0.2-1 V more cathodic than would occur in a conventional copper-plating electrolyte.

Other suitable complexing agents include citrate, pyrophosphate, oxalate, and a combination of the aforementioned complexing agents. Incorporating these complexing agents would also increase the cathodic potential and thereby remove the oxide film on ruthenium. Other complexing agents include triethanolamine, dimercaptosuccinic acid, nitrilotriacetate, dimercaprol, and desfuroxamine mesylate. Using the electrolyte as described, the copper plating reaction occurs at a cathodic potential of about 0.8 to 2.0 V.

In some embodiments, the electrolyte comprises 0.004-0.007M EDTA and 0.004-0.007M copper citrate. The electrolyte may have a pH of about 2-6. In some embodiments, the electrolyte also includes a wetting agent.

During the seed copper deposition, the power supply 135 applies a direct current to flow between the anode 113 and the wafer 107. In some embodiments, the current waveform has three sections or regimes. The first section is a forward current pulse of a first current for a first duration. The second section is pairs of alternating forward and reverse current pulses for a second duration. The third section is another forward current pulse for a third duration.

During the first section, some copper is plated onto the wafer. During the second section, copper is alternatively plated onto the wafer and removed from the wafer. It is found that this alternating deposition and removal greatly improves nucleation and coverage. The better coverage reduces the resistivity of a given thickness of copper deposited. During the removal pulse in a pulse pair, substantially all of the copper deposited during the forward pulse is removed (e.g., at least 50% or at least 80% of the previously deposited copper). One skilled in the art will be able to select a waveform that achieves this goal while taking into account the differences between current efficiency of the forward and reverse current pulses. In general, the forward current (deposition) is less efficient than the reverse current (removal). Care also must be taken not to over polish the surface.

After the second step, the wafer may have little or no copper deposited, as each pulse pair removes the copper it deposits. Substantially all of the copper seed layer is deposited during the third regime. In the third regime, a forward current is applied for a third duration to deposit the 15-60 angstrom seed film thickness.

Figure 2:
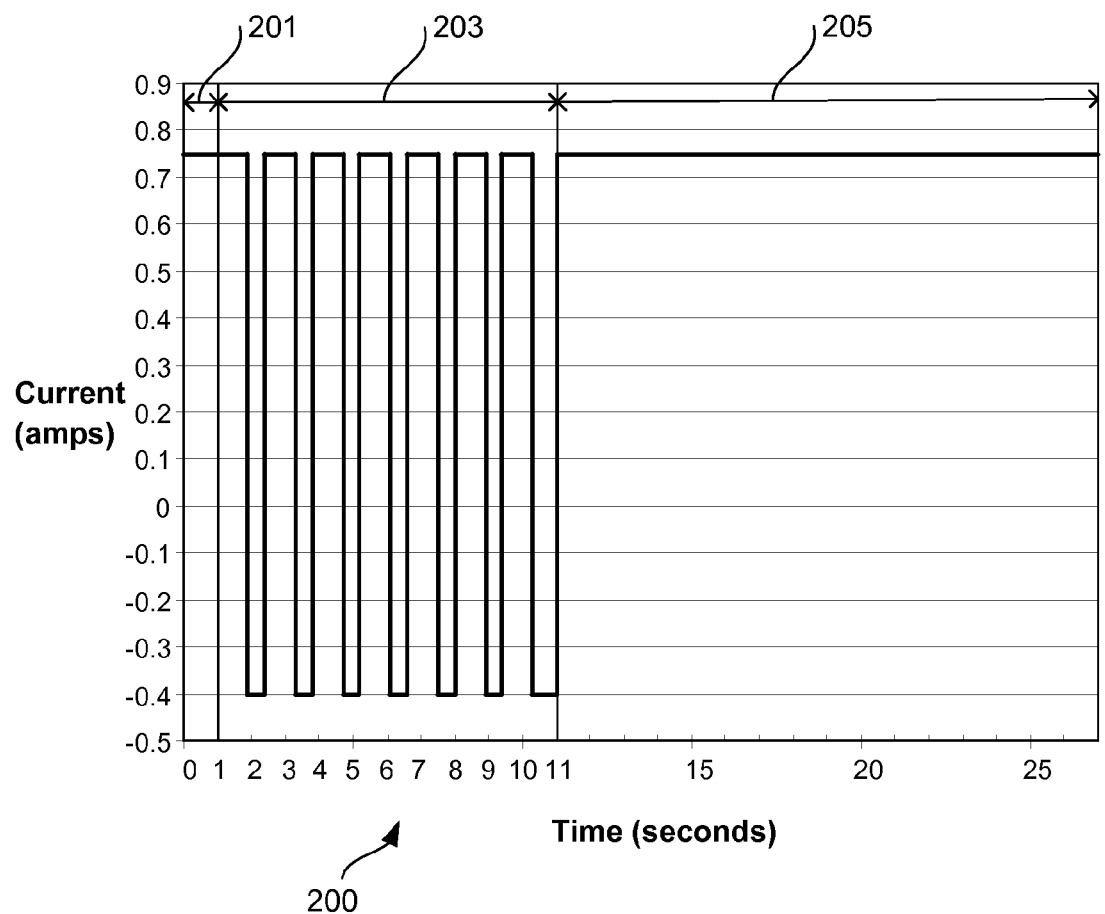
FIG. 2 is a diagram of one embodiment of the current waveform applied during the copper seed layer electroplating process.

In some 300 mm embodiments as shown in FIG. 2, in the first step 201, the forward current may be about 0.6-1.0 amps for a period of about 0.5-2 seconds. The second step 203 may include forward current pulses of between about 0.6-0.9 amps for a period of about 700-1500 milliseconds and include reverse current pulses of between about 0.2-0.5 amps for a period of about 400-600 milliseconds. The entire duration of the second step may be 8-15 seconds, for a total of about 5-15 pulse pairs. In the third step 205, the current may be about 0.6-1.0 amps for a period of about 10-22 seconds. Depending on the thickness of the seed layer required, one skilled in the art would determine the appropriate duration given the current flow and other electroplating process parameters.

Although a three-section waveform is described, this invention is not limited to such a waveform. For example, a waveform with fewer or more sections may be applied, with or without a section of forward and reverse pulse pairs. Thus, a much simpler waveform having only forward direct current may be used.

As discussed above, a thin conformal copper film between about 15 and 60 angstroms may be deposited as the seed layer. The minimum thickness is determined by the need to have continuous coverage on the ruthenium surface and the need to avoid full oxidation of the copper seed layer before the bulk-plating step. The second factor may be controlled by reducing the time between the seed and bulk plating step and the exposure to oxygen in the environment in between electroplating steps. Additionally, the sheet resistance also affects the minimum thickness. If the sheet resistance becomes too high the bulk electroplating may not be possible. The maximum thickness depends on the geometry of the features on the wafer. A reasonably low aspect ratio is required prior to the bulk plating. Generally, an aspect ratio of less than 15, preferably less than 10, is required prior to the bulk plating. A higher aspect ratio increases the probability that a feature opening would be pinched off leaving unfilled voids. The ability to deposit very thin seed layers onto very thin barrier layers enables filling of features 25 nm and below.

The metallization stack on a semiconductor wafer made using the methods of the current invention would include a dielectric layer, a semi-noble metal layer, an electroplated copper seed layer, and a bulk copper layer as viewed from the edge of an copper interconnect to the center of the interconnect. The semi-noble metal layer may be the metal diffusion barrier layer or a portion of a metal diffusion barrier layer. The other portion of a bi-layer metal diffusion barrier may be titanium (Ti), tantalum (Ta), tantalum nitride (TaN), tantalum nitride silicon (TaNSi), tungsten (W), titanium nitride (TiN) or titanium nitride silicon (TiNSi). In the bi-layer configuration, the stack viewed horizontally into the interconnect may include a dielectric layer, a tantalum nitride layer, a semi-noble metal layer, an electroplated copper seed layer and a bulk copper layer. The semi-noble metal layer may be ruthenium with a thickness of less than 50 angstroms, preferably 20-30 angstroms.

The electroplated copper seed layer in this metallization stack is more conformal than a PVD copper seed layer, so the thickness required to achieve a continuous coverage is reduced. The electroplated copper seed layer is relatively fine grained and amorphous compared to typical PVD copper seeds based on the much more rapid anneal rate of subsequently electrodeposited copper films. After the very thin seed layer is deposited, the bulk layer of copper may be deposited to fill the features. A separate bulk layer electroplating is necessary because the seed layer deposition is very slow. Although continuous deposition in the seed layer bath would yield good results, the wafer throughput would be very low and thus less desirable.

Electroplating a Bulk Layer to Fill the Features

Copper plating to fill the features is made more difficult by the very thin seed layer. As discussed above, very thin films have higher sheet resistance that produces a terminal effect under conventional copper electroplating conditions. The present invention involves a bulk-electroplating operations performed under conditions that reduce the terminal effect. These conditions may include modifications of electrolyte composition and introduction of new configurations of the plating apparatus.

In general, in order to achieve a uniform thickness distribution of plated copper on the wafer surface a uniform voltage profile should exist at the wafer surface during plating. In order to compensate for the terminal effect, it is necessary to compensate for the resistive voltage drop by increasing the voltage or current supplied to the inner regions of the wafer so that an equivalent interfacial potential is maintained across the full wafer surface. Alternatively, one may choose a shape of the anode chamber opening to match the plated wafer surface while adjusting for increased current flux to the edge of the wafer with shielding near the wafer edge.

The plating solution is typically composed of copper sulfate, sulfuric acid, chloride ions and organic additives. Sulfuric acid is added to the electrolyte to enhance conductivity of the plating solution. This allows electroplating at reduced applied voltages and improves uniformity of voltage applied to surfaces at varying distances from an anode. Uniform voltages lead to uniform deposition rates. Conversely, when anode and wafer are equidistant at all points, lower concentrations of acid can be used to uniformly increase resistance between the wafer and the anode. This large uniform increase in resistance can diminish the terminal effect of resistive seed layers. Therefore, it is preferred to use electrolytes with low or medium concentrations of sulfuric acid while plating on thin seed layers. Another method to increase the resistance of the electrolyte may be to use salts that form large anions in solution, discussed above.

A number of electroplating apparatus configurations have been developed in order to improve the uniformity of electroplating. These configurations include shielding, dynamic shielding, anode configurations, and second cathode configurations. Shielding involves positioning dielectric material between the anode and the wafer cathode. The dielectric inserts, known as sheaths and shields, can have a variety of geometries allowing them to block the current flow between the anode and the wafer over a portion of the edge of the wafer. The shielding may be dynamic. Dynamic shielding involves movement of an iris like mechanism to divert current toward the center of the wafer as needed to compensate for terminal effect or to achieve specific profile shaping. Various field shaping methods and apparatus are described in U.S. Pat. No. 6,402,923, "Method and Apparatus for Uniform Electroplating of Integrated Circuits Using a Variable Field Shaping Element", Mayer et. al., issued Jun. 11, 2002, which is incorporated herein by reference for all purposes.

A resistive element inserted close to a wafer surface and varying resistivity through the element may also modulate thickness distribution across the wafer. High resistivity virtual anodes are described in U.S. Pat. No. 6,773,571 issued Aug. 10, 2004, titled "Method And Apparatus For Uniform Electroplating Of Thin Metal Seeded Wafer Using Multiple Segmented Virtual Anode Sources" by Mayer et al., incorporated herein by reference for all purposes.

In particular, dielectric plates with hole patterns placed near the wafer surface as a means to modulate the resistive pathway between the anode and the wafer were described in U.S. Pat. No. 6,179,983 issued Jan. 30, 2001 to Reid et al., titled "Method And Apparatus For Treating Surface Including Virtual Anode," which is incorporated by reference herein for all purposes. Use of segmented anodes with dynamic control has also been described as a means to divert current towards either the center or the edge of a wafer. Azimuthally asymmetric anodes are described in U.S. patent application Ser. No. 11/179,984 filed Jul. 11, 2005 by Mayer et al., titled "Rotationally Asymmetric Variable Electrode Correction," which is also incorporated by reference herein for all purposes.

Yet another apparatus configuration to reduce the terminal effect is a second cathode located remotely with respect to the wafer. The remotely positioned second cathode allows modulation of current density at the wafer surface by diverting a portion of current flow from the near-edge region of the wafer to improve the uniformity of the plated layer.

Any of the modifications of electrolyte composition and new configurations of the plating apparatus may be used for the bulk electroplating on a wafer having a ruthenium coating and an electroplated seed. Particularly, combinations of the above configurations and electrolyte compositions may be effective. In one embodiment, low acid electrolyte chemistry was used with hardware configurations including high resistance virtual anode, dual cathode, and various dielectric inserts in the plating bath to shape the current field.

Process Flow

Figure 3:
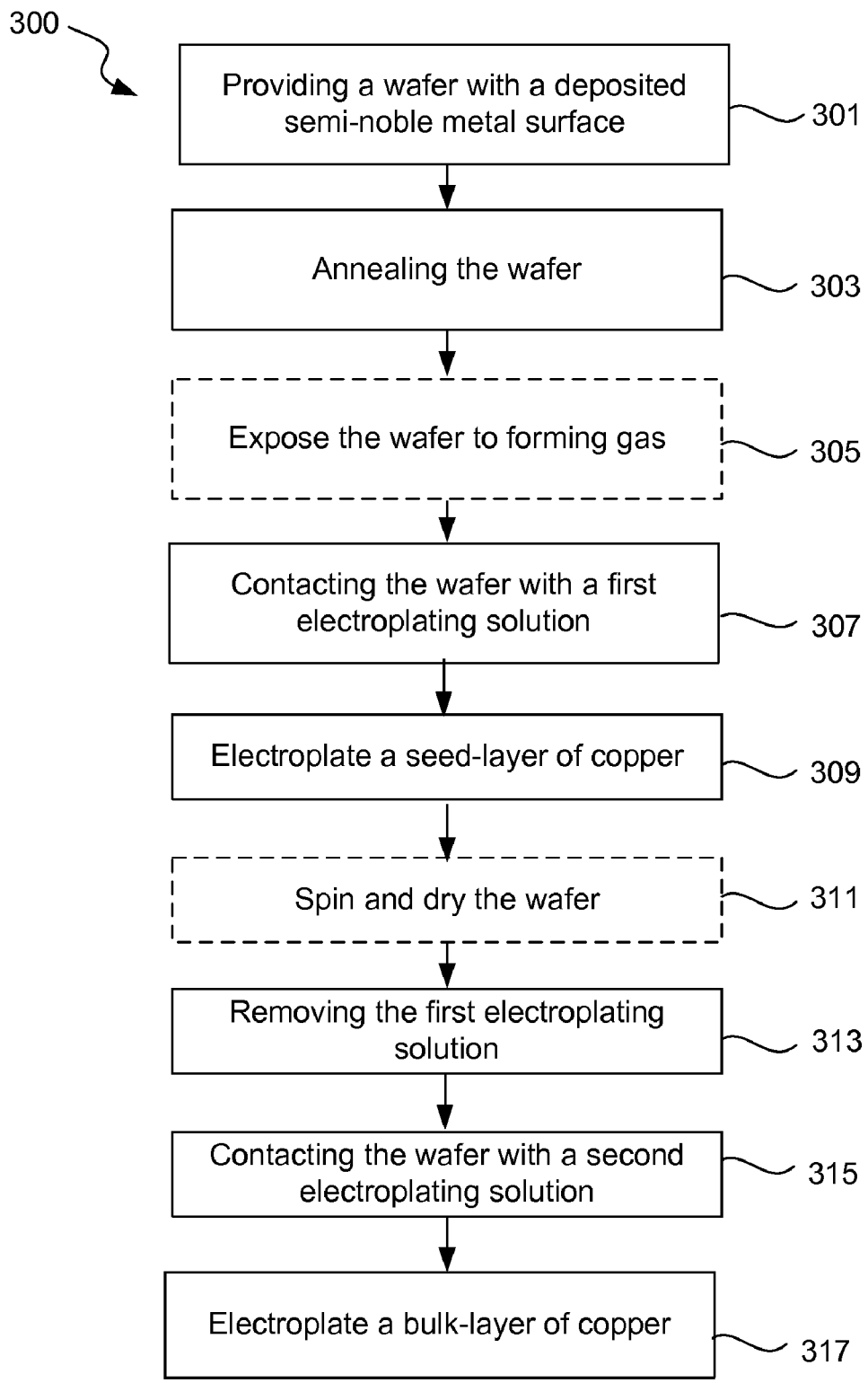
FIG. 3 is a process flow diagram illustrating some embodiments of the method in accordance with the present invention.

In addition to the seed electroplating and the bulk electroplating process described above, other process steps may be included. FIG. 3 is a process flow diagram 300 of one embodiment in accordance with the present invention. A wafer with a semi-noble metal deposited on its surface is provided 301. The wafer may be optionally annealed by heating the wafer to a temperature of between about 350-450° C. 303. The heat may be applied through a wafer support or a radiant source. During annealing, the wafer may be contacted with forming gas 305 to reduce oxides or to remove contaminants. Forming gas is nitrogen and up to 10% hydrogen. The anneal may be for a period of between 1 and 5 minutes. It is believed that annealing and contact with a reducing environment prepares the surface for electroplating and reduces the amount of oxide on the surface. The annealing step 303 may occur in the same semiconductor processing tool as the electroplating steps or in a separate tool. A suitable tool is the Sabre System manufactured by Novellus Systems of San Jose, Calif. or the Slim cell system manufactured by Applied Materials of Santa Clara, Calif. In certain embodiments, the annealing step 303 does not occur.

At some time before the seed layer of copper is electroplated, the first electroplating solution, or electrolyte, is provided in a first plating bath. The composition and properties of the seed layer electrolyte is described in detail above. The wafer is contacted with the first electroplating solution in the first bath 307. One or more plating baths may be used. If one plating bath is used, then the electrolyte may be changed out in between electroplating steps because different electrolytes are used. If more than one plating baths are used, then the wafer is transferred between electroplating steps and no electrolyte need be changed out.

After the wafer is annealed and the plating bath is ready, a seed layer of copper is deposited onto the wafer as described above 309. Because oxidation of the seed layer is undesirable, contact with the ambient environment is ideally minimized. However, the wafer may be spun, rinsed, and dried 311 in an inert environment or in ambient air. If only one plating bath is used, then the electrolyte must be removed 313 and a new electrolyte for the bulk plating received. Then the wafer is contacted with the second electroplating solution 315 and a bulk layer of copper may be deposited onto the wafer using a modified conventional copper electroplating process as described above 317.

Figure 4:
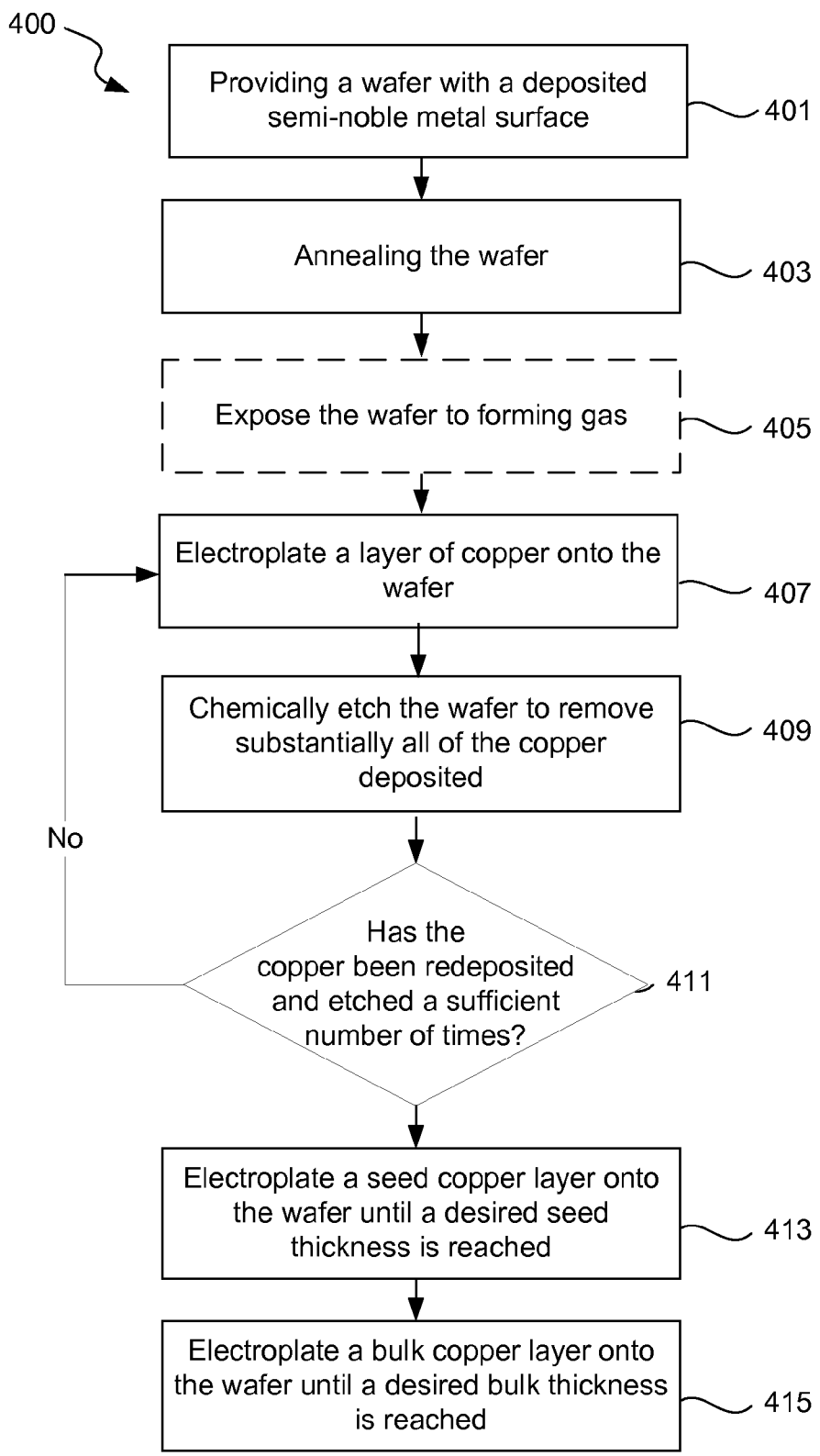
FIG. 4 is a process flow diagram illustrating an alternate embodiment of the method in accordance with the present invention.

In an alternate embodiment as shown in FIG. 4, a wafer with a semi-noble metal surface is provided 401. The wafer may be annealed 403 and exposed to forming gas 405 as the embodiment discussed above. However, before the seed layer copper to be used for subsequent electroplating in a bath which provides bottom-up fill is deposited, the wafer would be electroplated 407 and etched with a chemical agent 409 at least 2 times 411. Each chemical etch should ideally remove all of the copper deposited, or substantially all of the copper deposited. The chemical etchant may be peroxide, sulfuric acid, hydroiodic acid, glyoxylic acid, or a combination of these acids. In general, an acid that can etch copper but not etch the underlying semi-noble metal such as ruthenium may be used. It is believed that copper nucleation density, coverage, and uniformity increases with each iteration of the plating and etching operation. More repetitions are found to improve the quality of the copper deposited.

After the electroplating and etching steps have repeated at least 2 times, a seed layer of copper may be deposited by electroplating until a desired thickness is reached 413. The electrolyte used in this step is the same as that of step 309 and is described above. After the desired seed layer is deposited, then a bulk layer may be deposited onto the wafer 415 using the process described above.

This alternate embodiment replaces the current waveform with multiple steps of deposition and chemical etch, but accomplishes the same result as other embodiments discussed.

Apparatus

The present invention also pertains to the semiconductor apparatus capable of executing the process flow and the process conditions described above. The apparatus includes one or more electroplating baths and one or more robots for transferring wafers. The apparatus also includes a controller executing a set of instructions comprising instructions for receiving an electrolyte into one or more baths, providing a wafer, and electroplating a seed layer of copper onto the wafer by applying a current waveform. The electrolyte includes a copper salt and a copper complexing agent, and has a resistivity of at least about 200 ohm cm. A semi-noble metal is deposited onto the wafer prior to electroplating. The current waveform may include one or more forward direct current pulses, followed by a number of alternating forward and reverse direct current pulses, and a last forward direct current pulse. Substantially all of the copper deposition will occur in the final current pulse.

The apparatus controller may further execute a set of instructions that also include instructions for receiving a bulk electroplating solution into a second bath, providing the wafer with an electroplated seed layer and electroplating a bulk layer of copper onto the seed layer by applying a different current waveform. The bulk layer waveform may include several forward direct current pulses of various magnitude and duration.

For the apparatus that includes only one plating bath, the instructions may also include removing the seed layer electrolyte from the plating bath and receiving a bulk layer electrolyte at the plating bath before electroplating a bulk layer of copper onto the seed layer.

Suitable semiconductor processing tools include the Sabre System manufactured by Novellus Systems of San Jose, Calif. or the Slim cell system manufactured by Applied Materials of Santa Clara, Calif., or the Raider tool manufactured by Semitool of Kalispell, Mont.

EXAMPLES

Copper seed layers were electroplated onto ruthenium coated 300 mm blanket wafers in accordance with the present invention. The ruthenium thickness was 30 angstroms. The seed layer electrolyte used comprises 0.005M copper nitrate, 0.0055M EDTA, and DI water. DI water was replaced as it evaporates to keep the bath conductivity constant at about 0.9 milliSiemens. The electrolyte pH was about 3.7.

Figure 5:
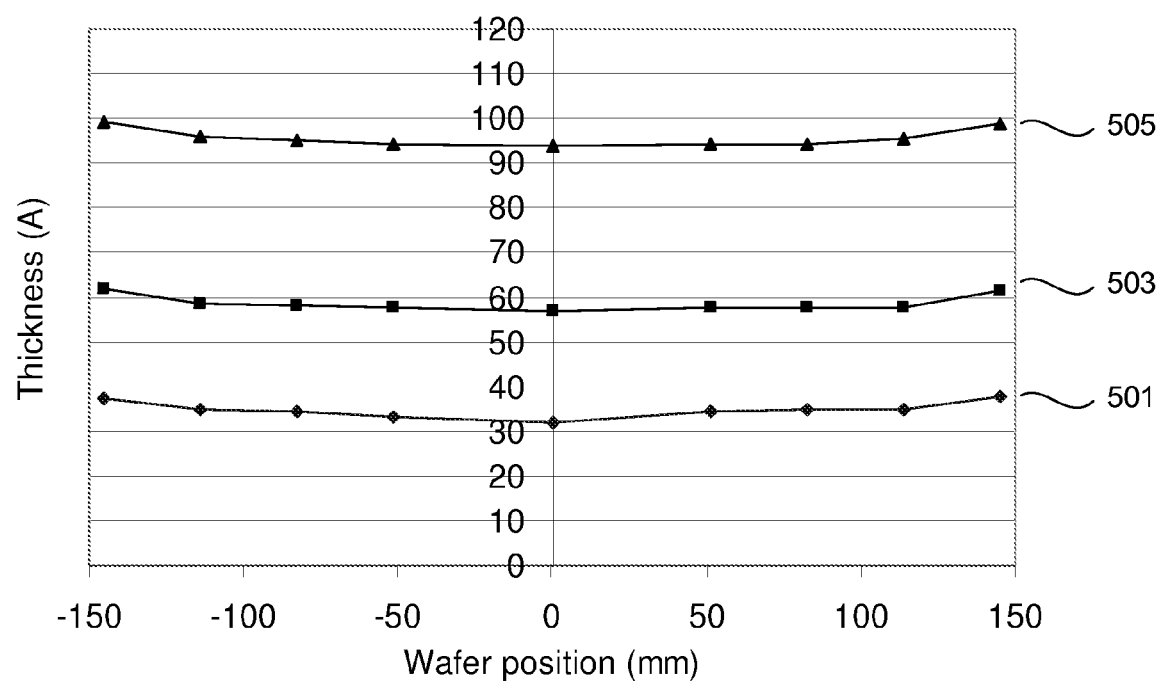
FIG. 5 is a plot of thickness profile data obtained using a method in accordance with the present invention.

FIG. 5 shows the thickness measurements at various points on three wafers, each deposited to a different thickness. The x-axis shows the thickness in angstroms measured at various y-axis wafer positions. Each wafer was deposited using a current waveform having three steps. The first step is a direct current of 0.75 amps for 1 second. The second step is alternating pulses of forward current at 0.75 amps for 900 milliseconds and reverse current at 0.4 amps for 500 milliseconds for a total second step duration of 10 seconds. The third step is a direct current of 0.75 amps. The durations are different for each wafer. As discussed above, substantially all of the copper is deposited in the third step. Therefore, the duration of the third step determines the thickness of the copper for a set of given conditions.

The third step was applied for 8, 16, and 32 seconds on different wafers and the results plotted. Curve 501 corresponds to 8 seconds; 503, 16 seconds; and 505, 32 seconds. The range of thicknesses for curves 501 and 505 are within 6 angstroms, and for curve 503, within 5 angstroms. The sheet resistance of a 50 angstrom seed layer is 30 ohm/sq. Each of the layers also passed a tape/scribe test for adhesion.

A bulk copper layer was thereafter deposited onto the seed layer using low and medium acid chemistry. Low acid chemistry contains 10 g/L sulfuric acid, 40 g/L copper, 50 mg/L chloride ion, and organic additives. Medium acid chemistry contains 80 g/L sulfuric acid, 50 g/L copper, 50 mg/L chloride ion, and organic additives. Organic additives include, for example, Viaform, Viaform NExT, and Extreme, all supplied by Enthone, New Haven, Conn. Although the thickness profile after 0.5 micron deposition is found to be acceptable using either acid chemistry, the low acid chemistry is found to be more uniform even at 200 angstroms.

This example demonstrates that the methods of the present invention may be used to successfully deposit copper onto ruthenium-coated wafers in a two-step electroplating process. One skilled in the art would be able to optimize the process conditions to achieve good fills and uniformity in accordance with the present invention. Because a very thin seed layer is used, the methods of the present invention enables device manufacturing with copper interconnects in features as small as 25 nm or below.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A semiconductor processing method for depositing copper comprising:
   providing a semiconductor wafer having a semi-noble metal layer thereon;
   depositing a seed layer of copper onto the metal layer using an electroplating process with an electrolyte comprising a copper salt and a copper complexing agent, wherein the electrolyte has a resistivity of at least about 200 ohms cm, thereby promoting a generally uniform deposition rate across a plating surface of the wafer.

2. The method of claim 1 further comprising:
   depositing a bulk-layer of copper onto the seed layer of copper using an electroplating process employing a second electrolyte.

3. The method of claim 2, wherein the bulk-layer deposition process is performed under conditions that reduce the terminal effect.

4. The method of claim 3, wherein the bulk-layer deposition is performed by using a high resistivity virtual anode.

5. The method of claim 3, wherein the bulk-layer deposition is performed by using a sheath.

6. The method of claim 3, wherein the bulk-layer deposition is performed by using a plastic barrier with holes between the wafer and an anode.

7. The method of claim 3, wherein the bulk-layer deposition is performed by using one or more azimuthally asymmetric anodes.

8. The method of claim 3, wherein the bulk-layer deposition is performed by using baffles and/or plates to direct the flow of cations in the second electrolyte.

9. The method of claim 1, wherein the copper salt forms large anions in the electrolyte.

10. The method of claim 1, further comprising:
    pretreating the wafer having a semi-noble metal layer by annealing the wafer and contacting the wafer with a forming gas.

11. The method of claim 10, wherein the wafer is heated to a temperature of between about 350 and 450 degrees Celsius to anneal the wafer.

12. The method of claim 10, wherein the wafer is heated for a period of between about 1 and 5 minutes.

13. The method of claim 1, further comprising:
    spinning and drying the wafer after depositing the seed layer.

14. The method of claim 1, wherein the electrolyte resistivity is 200-5000 ohms cm.

15. The method of claim 1, wherein the electrolyte resistivity is 400-4000 ohms cm.

16. The method of claim 1, wherein the electrolyte resistivity is 1000-2000 ohms cm.

17. The method of claim 1, wherein the complexing agent is EDTA, citrate, pyrophosphate, oxalate, triethanolamine, dimercaptosuccinic acid, nitrilotriacetate, dimercaprol, desfuroxamine mesylate or combinations thereof.

18. The method of claim 1, wherein the copper salt is copper citrate, copper pyrophosphate, or copper oxalate.

19. The method of claim 1, wherein the electrolyte has a pH of about 2-6.

20. The method of claim 1, wherein the electrolyte comprises:
    the complexing agent of EDTA at about 0.004-0.007M; and
    the copper salt of copper citrate at about 0.004-0.007M.

21. The method of claim 1, wherein the electrolyte causes a copper plating reaction to occur at a cathodic potential of about 0.8-2.0 volts.

22. The method of claim 1, wherein the electrolyte causes a copper plating reaction to occur at a potential that is 200-1000 millivolts more cathodic than would occur in a conventional copper plating electrolyte.

23. The method of claim 1, wherein the electrolyte further comprises a wetting agent, wherein the wetting agent does not substantially impact the conductivity of the electrolyte.

24. The method of claim 23, wherein the wetting agent is polyethylene glycol, polypropylene glycol, or co-polymers of these chemicals.

25. The method of claim 23, wherein the concentration of the wetting agent is about 10-1000 mg/L.

26. The method of claim 23, wherein the concentration of the wetting agent is about 200-500 mg/L.

27. The method of claim 1, wherein the seed layer of copper deposited has a thickness of about 15-60 angstroms.

28. The method of claim 1, wherein features on the wafer after the seed layer copper deposition have an aspect-ratio less than about 15.

29. The method of claim 1, wherein features on the wafer after the seed layer copper deposition have an aspect-ratio less than about 10.

30. The method of claim 1, wherein depositing the seed layer comprises applying a current waveform, comprising:
- a first step of applying a direct current for a first duration;
- a second step of alternating forward and reverse current pulses for a second duration; and
- a third step of applying a direct current for a third duration, wherein substantially all of the copper seed layer is deposited during the third step.

31. The method of claim 30, wherein the reverse current pulses strip off substantially all of the copper deposited during the forward current pulses.

32. The method of claim 31, wherein based on a 300 mm wafer, the forward current pulse is between about 0.6-0.9 amp for a period of about 700-1500 milliseconds, the reverse current pulse is about 0.2-0.5 amp for a period of about 400-600 milliseconds, and the second duration is about 8-15 seconds.

33. The method of claim 30, wherein the direct current of the first step is between about 0.6-1.0 amp for a period of about 0.5-2 seconds.

34. The method of claim 30, wherein the direct current of the third step is between about 0.6-1.0 amp, and the third duration is about 10-22 seconds to deposit a 30-70 angstrom seed layer.

35. The method of claim 1, wherein the semi-noble metal is ruthenium, palladium, rhodium, iridium, osmium, cobalt, or nickel.

36. The method of claim 1, wherein the semi-noble metal layer serves as at least a portion of a diffusion barrier.

37. A semiconductor processing method for depositing copper comprising:
- (a) providing a wafer;
- (b) depositing copper onto the wafer using a wet deposition process;
- (c) chemically etching the wafer so as to remove substantially all of the copper deposited;
- (d) repeating steps (b) and (c) for at least 2 times; and
- (e) depositing copper onto the wafer using an electroplating process until a desired thickness is reached.

38. The method of claim 37, wherein the wet deposition process is the seed layer depositing step of claim 1.

39. The method of claim 37, wherein a chemical etchant used for chemically etching the wafer comprises peroxide and sulfuric acid, hydroiodic acid, glyoxylic acid, or a combination thereof.

40. The method of claim 37, wherein the wafer has a semi-noble metal layer thereon.

* * * * *

UNITED STATES PATENT AND TRADEMARK OFFICE
CERTIFICATE OF CORRECTION

| | |
|---|---|
| PATENT NO. | : 7,799,684 B1 |
| APPLICATION NO. | : 11/682175 |
| DATED | : September 21, 2010 |
| INVENTOR(S) | : Jonathan Reid et al. |

Page 1 of 1

It is certified that error appears in the above-identified patent and that said Letters Patent is hereby corrected as shown below:

In line 10 of claim 1 (column 13, line 56) change "water" to --wafer--.

Signed and Sealed this
Twenty-first Day of June, 2011

David J. Kappos
*Director of the United States Patent and Trademark Office*